(12) United States Patent
Jang et al.

(10) Patent No.: US 6,967,120 B2
(45) Date of Patent: Nov. 22, 2005

(54) PINNED PHOTODIODE FOR A CMOS IMAGE SENSOR AND FABRICATING METHOD THEREOF

(75) Inventors: Hoon Jang, Cheongju-si (KR); Keun Hyuk Lim, Seoul (KR)

(73) Assignee: Dongbu Anam Semiconductor, Seoul (KR)

( * ) Notice: Subject to any disclaimer, the term of this patent is extended or adjusted under 35 U.S.C. 154(b) by 0 days.

(21) Appl. No.: 10/831,815

(22) Filed: Apr. 26, 2004

(65) Prior Publication Data

US 2004/0232417 A1 Nov. 25, 2004

Related U.S. Application Data

(62) Division of application No. 10/623,389, filed on Jul. 18, 2003, now Pat. No. 6,781,171.

(30) Foreign Application Priority Data

Jul. 19, 2002 (KR) .................. 10-2002-0042406

(51) Int. Cl.$^7$ .............................................. H01L 21/00
(52) U.S. Cl. ............................................. 438/57; 438/48
(58) Field of Search ...................... 438/48, 57

(56) References Cited

U.S. PATENT DOCUMENTS

| | | | |
|---|---|---|---|
| 5,625,210 A | 4/1997 | Lee et al. | 257/292 |
| 5,903,021 A | 5/1999 | Lee et al. | 257/292 |
| 6,027,955 A | 2/2000 | Lee et al. | 438/57 |

*Primary Examiner*—Long Pham
(74) *Attorney, Agent, or Firm*—Hanley, Flight & Zimmerman LLC

(57) ABSTRACT

A pinned photodiode for a CMOS image sensor and fabricating method thereof is disclosed. The disclosed pinned photodiode can reduce a probability of recombination of excess electrons by forming a second potential well having a center-cross form across a photodiode area. The disclosed pinned photodiode-fabricating method comprises forming a photodiode on a substrate, forming a first potential well between the substrate and the photodiode, and forming a second potential well having a center-cross form across said photodiode, which is positioned more deeply than said first potential well.

5 Claims, 2 Drawing Sheets

PINNED PHOTODIODE FOR A CMOS IMAGE SENSOR AND FABRICATING METHOD THEREOF

This application is a DIV of Ser. No. 10/623,389, filed Jul. 18, 2003, U.S. Pat. No. 6,781,171.

TECHNICAL FIELD

The present disclosure pertains to a pinned photodiode and, more particularly, a pinned photodiode for a CMOS image sensor having enhanced performance and a method of making the pinned photodiode.

BACKGROUND

In a conventional complimentary metal oxide semiconductor (CMOS) image sensor, a pinned photodiode using three transistors attracts excess electrons generated by incident light on a photodiode area and uses a drive transistor to transfer the excess electrons. In such conventional art, a potential well where electrons are attracted and stored is formed on one corner of photodiode area around a contact. Therefore, electrons generated by light can recombine while moving to a potential well because of the long distance between a location where the electrons are generated and the location of the potential well where the electrons are drawn by a drive transistor. This results in poor transistor operation characteristics. In addition, the photodiode area accepting light rays is decreased in size because the area of the potential well formed is excessively broad, thereby having negative influences on device operation characteristics.

Such problems in the prior art are described referring to FIGS. 1 and 2. FIG. 1 is a layout of a conventional photodiode having three transistors, illustrating the trajectory of excess electrons generated by light are transferred. As shown in FIG. 1, a layout of a conventional photodiode having three transistors includes a photodiode area 1, a supply voltage line 5, a select transistor 2, a drive transistor 3, a reset transistor 6, an N+ potential well area 7b, and a contact 4. FIG. 2 is a cross-sectional view of FIG. 1 taken along lines A–A', illustrating a cross-section of a known pinned photodiode. A conventional photodiode has a first N+ potential well area 7a as an N type impurity area, which is formed between a P type substrate 8 and the photodiode area 1, and a second N+ potential well 7b that is positioned more deeply than the first N+ potential well 7a and formed on a part of the P type substrate 8 where the photodiode area 1 is not formed, near a reset transistor 6. As shown FIG. 2, excess electrons generated by light in a pinned photodiode are transferred into the deeply formed second N+ potential well 7b.

Thus, in a conventional pinned photodiode, excess electrons are generated on a photodiode area when a pixel area accepts light rays, and the excess electrons are stored in another potential well. A pinned photodiode with three transistors has another deeper potential well, which is located right next to a reset transistor, than a potential well on a photodiode area. Therefore, excess electrons generated are stored in the deeper potential well due to a characteristic of electrons that prefer stable state, and, subsequently, are transferred through a contact.

However, because the deeper potential well is located next to a reset transistor positioned on one corner of a pinned photodiode, excess electrons generated by light on a pinned photodiode area can be recombined during movement to the deeper potential well. In addition, such disadvantage has a negative effect on transistor operation characteristics by reducing photocurrent of a photodiode.

DETAILED DESCRIPTION

Figure 3:
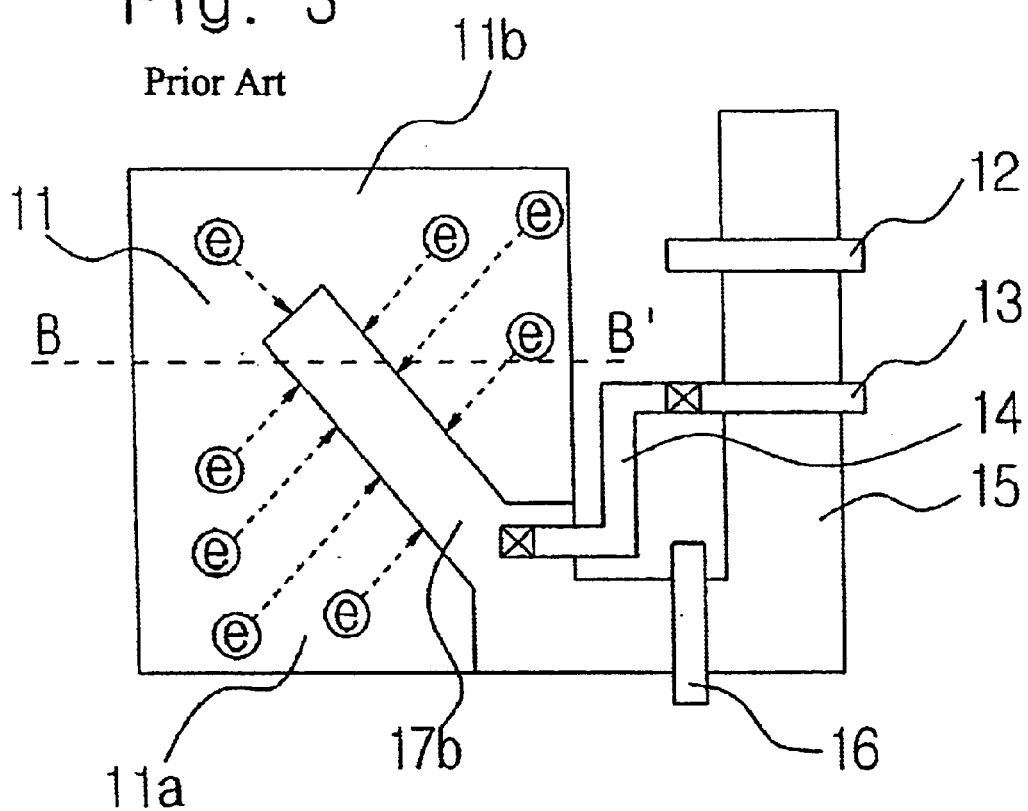
FIG. 3 is a layout of a pinned photodiode for a disclosed CMOS image sensor.

FIG. 3 is a layout of a pinned photodiode having three transistors, illustrating the trajectories of excess electrons generated by light. As shown in FIG. 3, an potential well area 17b storing excess electrons has a center-cross form across a photodiode area 11, and is electrically connected with a drive transistor 13 so that the drive transistor is worked by an electric potential of the potential well area 17b and can transfer supply voltages. Here, the potential well area 17b may be an N+ potential well or P+ potential well. A select transistor 12 and a reset transistor 16 are connected to a supply voltage line 15.

Figure 1:
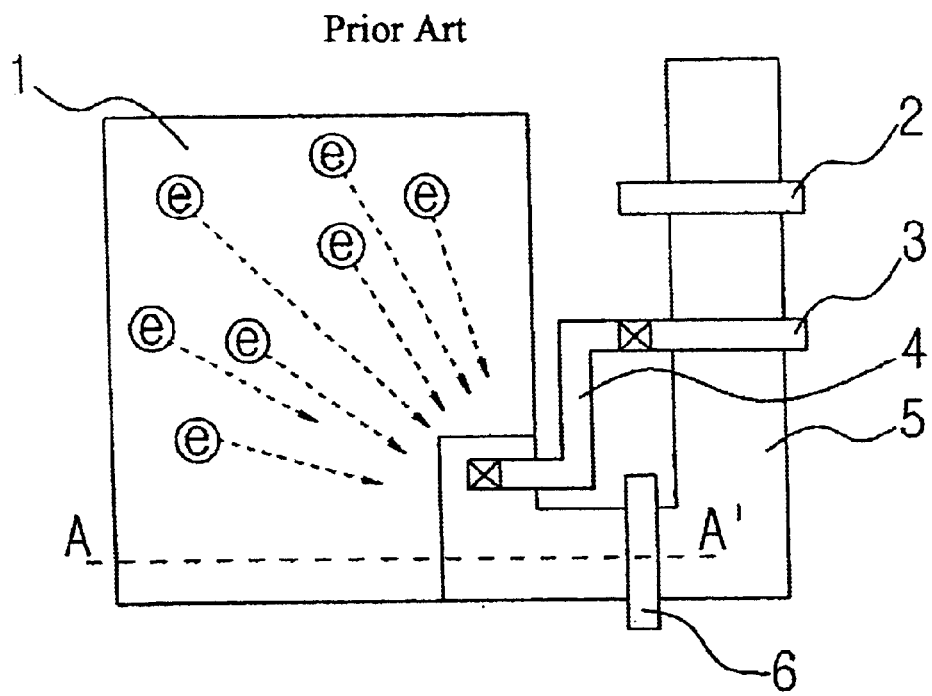
FIG. 1 is a layout of a pinned photodiode for a CMOS image sensor according to a conventional art.
Figure 2:
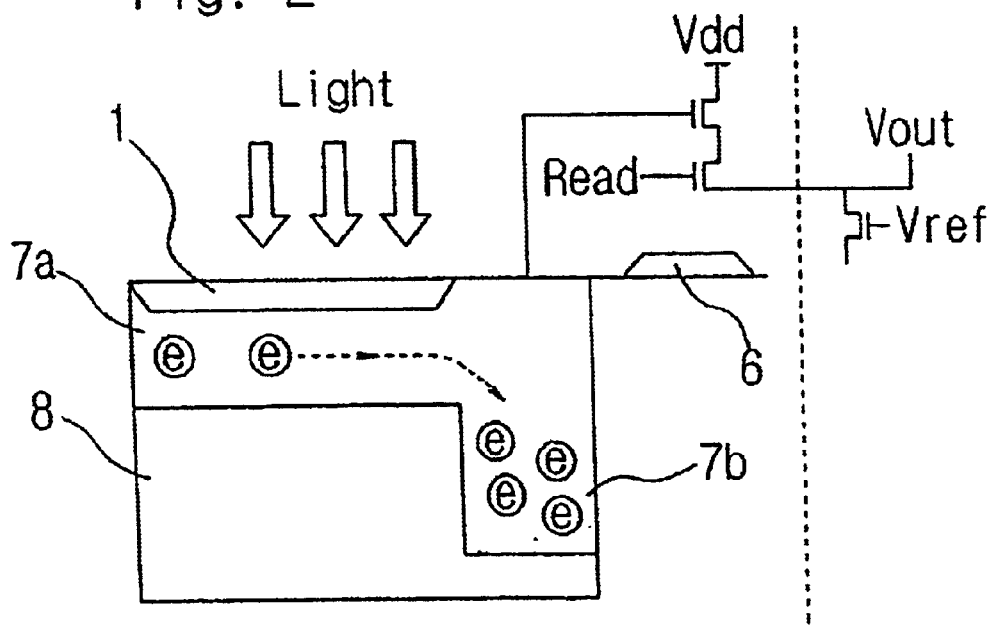
FIG. 2 is a cross-sectional view of FIG. 1 taken along lines A–A'.
Figure 4:
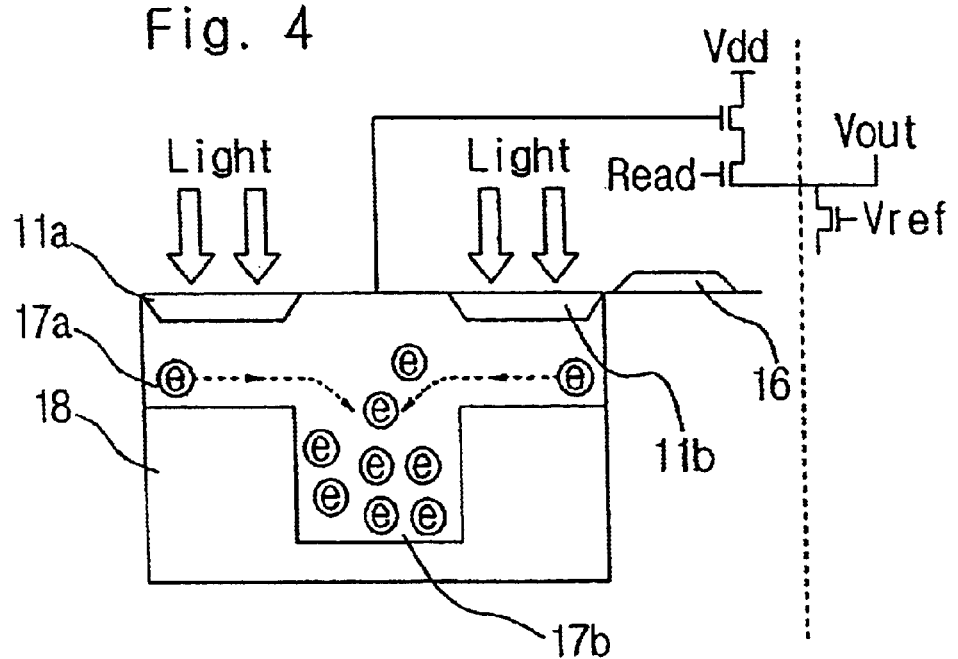
FIG. 4 is a cross-sectional view of FIG. 3 taken along lines B–B'.

FIG. 4 is a cross-sectional view of FIG. 3 taken along lines B–B', illustrating a cross-sectional view of a disclosed pinned photodiode. The disclosed pinned photodiode has a first potential well 17a, an N or P type impurity area, which is formed between a substrate 18 and a photodiode area 1, and a second potential well area 17b having a center-cross form across the photodiode area 11, which is positioned more deeply than the first potential well 17a. The first potential well 17a may be an N+ potential well or a P+ potential well. The second potential well 17b may be also an N+ potential well or a P+ potential well. In addition, the substrate may be a P type or an N type. As shown in FIG. 4, excess electrons generated by light in the first potential well 17a can move easily to the neighboring second potential well 17b. As a result, the excess electrons travel shorter distance than excess electrons in FIG. 2, and a probability of recombination of the excess electrons is reduced greatly, thereby enhancing operation characteristics of pinned photodiode.

Thus, a pinned photodiode for a CMOS image sensor as disclosed herein includes, by way of example, a first potential well formed between a substrate and a photodiode and a second potential well having a center-cross form across said photodiode and being positioned more deeply than said first potential well.

In addition, a method of making the disclosed pinned photodiode for a CMOS image sensor may include, for example, forming a photodiode on a substrate, forming a first potential well between the substrate and the photodiode, and forming a second potential well having a center-cross form across the photodiode. In such an arrangement, the second potential well may be positioned more deeply than the first potential well, so that excess electrons generated by light in the first potential well can move easily to the neighboring second potential well.

The first potential well may be an N+ potential well or P+ potential well. The second potential well may also be an N+ potential well or a P+ potential well. In addition, the first and second potential wells may be formed by means of ion implantation or thermal diffusion. The substrate may be a P type or an N type.

The foregoing disclosure is directed to a pinned photodiode for a CMOS image sensor that substantially obviates one or more problems due to limitations and disadvantages of the related art, and a method of making the pinned photodiode.

The disclosed CMOS image sensor provides a pinned photodiode for a CMOS image sensor having enhanced operation characteristics. Additionally, disclose herein is a method of making a pinned photodiode for a CMOS image sensor having enhanced operation characteristics, by forming a potential well crossing the center of a photodiode area in order to maximize the photodiode area accepting light rays and minimize a distance for which excess electrons, which are generated when a driver transistor is turned on, travel to the potential well.

The foregoing embodiments are merely exemplary and are not to be construed as limiting. The present teachings can be readily applied to other types of apparatuses. The foregoing description is intended to be illustrative, and not to limit the scope of the claims. Many alternatives, modifications, and variations will be apparent to those skilled in the art. Although certain apparatus constructed in accordance with this disclosure have been described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method of making a pinned photodiode for a CMOS image sensor, comprising:

forming a photodiode on a substrate;

forming a first potential well in said substrate;

forming a second potential well having a center-cross form across said photodiode, the second potential well being positioned more deeply than said first potential well, so that excess electrons generated by light in said first potential well can move easily to said neighboring second potential well.

2. A method as defined by claim 1, wherein said substrate is a P type or an N type.

3. A method as defined by claim 1, wherein said first potential well is a P+ potential well or an N+ potential well.

4. A method as defined by claim 1, wherein said second potential well is a P+ potential well or an N+ potential well.

5. A method as defined by claim 1, wherein said first potential well and said second potential well are formed by means of ion implantation or thermal diffusion.

* * * * *